(12) United States Patent
Uchida et al.

(10) Patent No.: US 8,907,493 B2
(45) Date of Patent: Dec. 9, 2014

(54) SEMICONDUCTOR DEVICE AND METHOD OF MANUFACTURING THE SAME

(71) Applicant: Kabushiki Kaisha Toshiba, Tokyo (JP)

(72) Inventors: Kengo Uchida, Oita (JP); Kazuyuki Higashi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 149 days.

(21) Appl. No.: 13/762,223

(22) Filed: Feb. 7, 2013

(65) Prior Publication Data

US 2014/0054774 A1 Feb. 27, 2014

(30) Foreign Application Priority Data

Aug. 21, 2012 (JP) ................. 2012-182632

(51) Int. Cl.
*H01L 23/48* (2006.01)
*H01L 23/52* (2006.01)
*H01L 29/40* (2006.01)

(52) U.S. Cl.
USPC ............ 257/774; 257/E23.011; 257/751; 257/775; 438/653

(58) Field of Classification Search
CPC ............. H01L 23/5226; H01L 2924/01078; H01L 2924/01079
USPC ............ 257/E23.011, E23.067, E23.068, 257/E21.577, E21.53, 621, 737, 751, 257/774–776, 760, 786; 438/16, 623, 624, 438/638, 653, 667, 725, 763, 780
See application file for complete search history.

(56) References Cited

U.S. PATENT DOCUMENTS

| 6,841,469 | B2 * | 1/2005 | Sawada et al. | 438/629 |
| 7,341,950 | B2 * | 3/2008 | Lo et al. | 438/702 |
| 8,541,878 | B2 * | 9/2013 | Takahashi et al. | 257/760 |
| 8,742,535 | B2 * | 6/2014 | Bachman et al. | 257/508 |
| 2010/0007030 | A1 | 1/2010 | Koike et al. | |
| 2010/0224965 | A1 * | 9/2010 | Kuo | 257/621 |
| 2011/0006437 | A1 * | 1/2011 | Tsao et al. | 257/774 |
| 2011/0079917 | A1 * | 4/2011 | Xia et al. | 257/774 |
| 2012/0091593 | A1 * | 4/2012 | Cheng et al. | 257/774 |
| 2012/0282777 | A1 * | 11/2012 | Shih et al. | 438/702 |
| 2013/0037944 | A1 * | 2/2013 | Lee et al. | 257/737 |
| 2013/0313718 | A1 * | 11/2013 | Varghese et al. | 257/774 |

FOREIGN PATENT DOCUMENTS

| JP | 07-074148 A | 3/1995 |
| JP | 2010-021352 A | 1/2010 |
| JP | 2011-023453 A | 2/2011 |
| WO | WO 2011/007472 A1 | 1/2011 |

* cited by examiner

*Primary Examiner* — Chris Chu
(74) *Attorney, Agent, or Firm* — Holtz, Holtz, Goodman & Chick PC

(57) ABSTRACT

A first through hole 16 and a second through hole 17 are formed which penetrate from a rear surface 10*a* side of an element formation surface 10*b* of a semiconductor substrate (silicon substrate 10) in which an element section Ra is formed, to the element formation surface. An outer circumference insulation film 12 is formed on the side wall of the bottom of the second through hole 17 to surround the outer circumference of the second through hole 17 having a larger opening diameter among these through holes.

20 Claims, 19 Drawing Sheets ured along the line X-X' of FIG. 14A;

SEMICONDUCTOR DEVICE AND METHOD OF MANUFACTURING THE SAME

CROSS-REFERENCE TO RELATED APPLICATIONS

This application is based upon and claims the benefit of priority from Japanese Patent Application No. 2012-182632, filed on Aug. 21, 2012; the entire contents of which are incorporated herein by reference.

FIELD

Embodiments described herein relate generally to a semiconductor device and a method of manufacturing the same.

BACKGROUND

In recent years, semiconductor devices in which a plurality of semiconductor chips are laminated, such as a multi chip package (MCP) which is a representative example, are effectively utilized to achieve densification, miniaturization, and thinning of the semiconductor device.

A through silicon via (TSV) has been popularized as an example of technologies for laminating semiconductor chips in such kinds of semiconductor devices. The TSV refers to, for example, a through electrode that penetrates through between main surfaces of a semiconductor substrate which is a base substrate of the semiconductor chips. Various processes of manufacturing such kinds of semiconductor devices have been devised to improve a throughput and increase the degree of integration in a thickness direction.

In a semiconductor device, a TSV and a silicon through structure having a larger area than the TSV are present at the same layer in some cases. At this time, the silicon through structure is etched more excessively than the TSV by the micro-loading effect when reactive ion etching (RIE) is performed. In such a structure, when the silicon through structure is etched more excessively by the RIE, the bottom silicon of the silicon through structure having the larger cross-sectional area than the TSV is etched in a direction perpendicular to an etching direction (notching). At this time, the notched portion may cause a defect.

BRIEF DESCRIPTION OF THE DRAWINGS

FIG. 4A is a cross-sectional view and FIG. 4B is a cross-sectional view taken along the line X-X' according to FIG. 4A;

FIG. 5A is a cross-sectional view and FIG. 5B is a cross-sectional view taken along the line X-X' of FIG. 5A;

FIG. 6A is a cross-sectional view and FIG. 6B is a cross-sectional view taken along the line X-X' of FIG. 6A;

FIG. 7A is a cross-sectional view and FIG. 7B is a cross-sectional view taken along the line X-X' of FIG. 7A;

FIG. 8B is a cross-sectional view taken along the line X-X' of FIG. 8A;

FIG. 14A is a cross-sectional view and FIG. 14B is a cross-sectional view taken along the line X-X' of FIG. 14A;

FIG. 15A is a cross-sectional view and FIG. 15B is a cross-sectional view taken along the line X-X' of FIG. 15A;

DETAILED DESCRIPTION

According to an embodiment of the invention, first and second through holes are formed which penetrate from the rear surface of an element formation surface of a semiconductor substrate in which an element section is formed to the element formation surface. On the semiconductor substrate, an outer circumference insulation film is formed on the side wall of the bottom of the through holes such that the outer circumference insulation film surrounds at least the outer circumference of the second through hole having a larger opening diameter among these through holes.

Hereinafter, a semiconductor device and a method of manufacturing the semiconductor device according to embodiments will be described in detail with reference to the accompanying drawings. Note that, the invention is not limited to the embodiments.

(First Embodiment)

Figure 1:
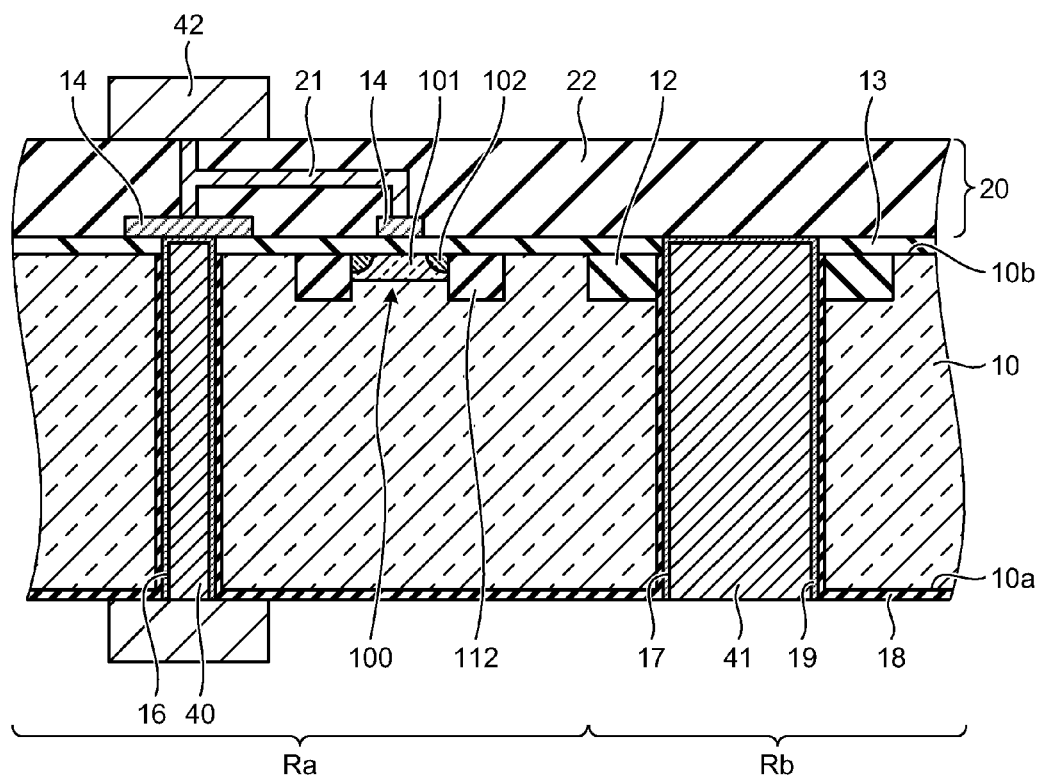
FIG. 1 is a sectional view illustrating the overall configuration of main units of a semiconductor device according to a first embodiment.
Figure 2:
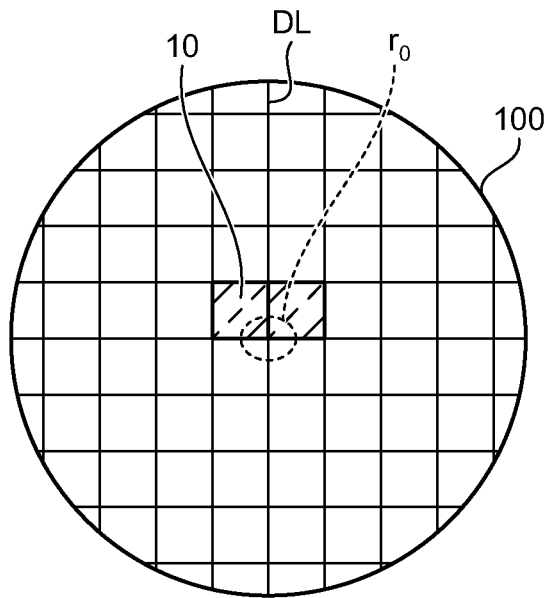
FIG. 2 is a view illustrating the position of the semiconductor device on a wafer according to the first embodiment.
Figure 3:
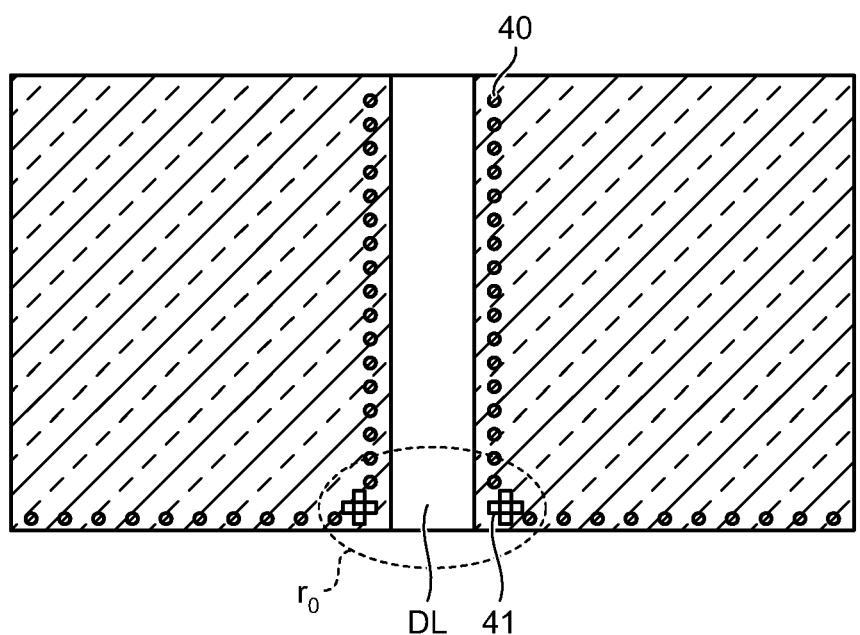
FIG. 3 is an expanded view illustrating main units of FIG. 2.
Figure 4A:
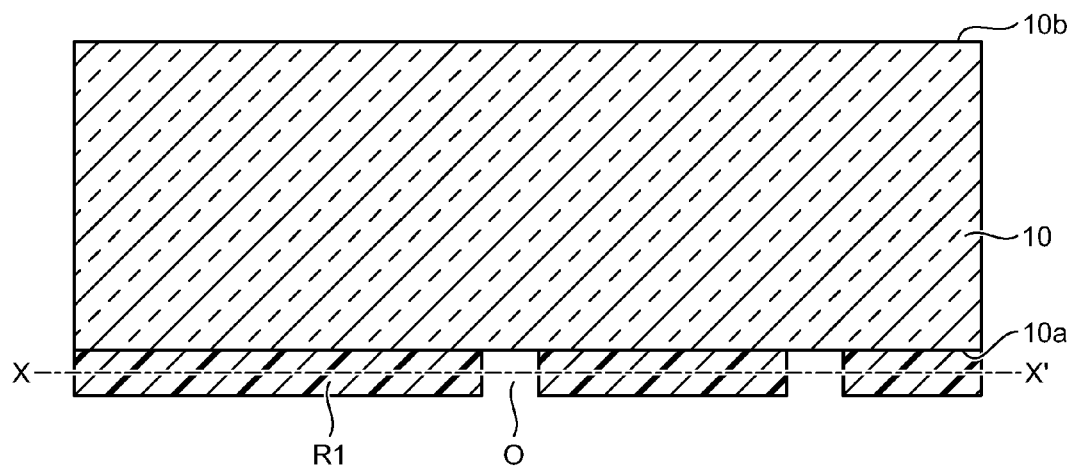
FIGS. 4A and 4B are cross-sectional views illustrating a process of manufacturing the semiconductor device according to the first embodiment.
Figure 4B:
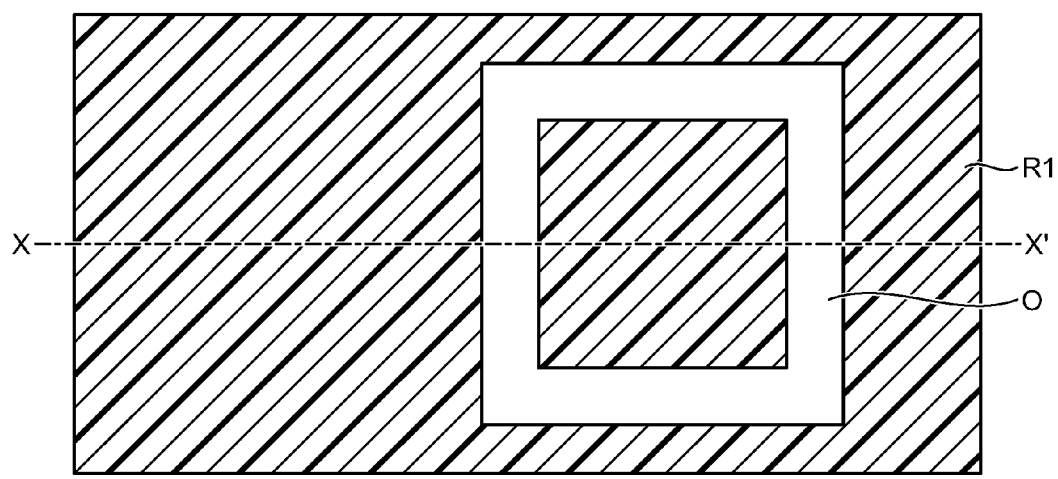

FIG. 1 is a cross-sectional view illustrating an overall configuration of main units of a semiconductor device according to a first embodiment. FIG. 2 is a view illustrating a position of the semiconductor device of FIG. 1 on a wafer. FIG. 3 is an expanded view illustrating main units of FIG. 2.

The semiconductor device according to the first embodiment includes a silicon substrate 10 as a semiconductor substrate in which an element 100 such as MOSFET is formed. The semiconductor device includes: an element section Ra including a silicon through electrode (TSV) 40; and a silicon through structure 41 which is a mark structure disposed in a cross shape in a peripheral section Rb of the element section Ra. The silicon through structure 41 is configured as a mark structure. The semiconductor device includes a first through hole 16 and a second through hole 17 that penetrate from a rear surface 10a side of an element formation surface 10b of the silicon substrate 10 to the element formation surface 10b. The first through hole 16 and the second through hole 17 are filled with copper, and a silicon through electrode 40 and the silicon through structure 41 are formed, respectively. The opening diameter of the first through hole 16 is different from that of the second through hole 17. An outer circumference insulation film 12 is formed on the side wall of the bottom of the second through hole 17 so as to surround the outer circumference of the second through hole 17 having the larger opening diameter. Silicon nitride ($Si_3N_4$) is used as the outer circumference insulation film 12. The silicon through structure 41 configured as the mark structure is used as an alignment mark at the time of manufacturing and assembling the semiconductor device.

In the first through hole 16 and the second through hole 17, an inner wall insulation film 18 is formed to cover the inner wall of the through hole except the bottom portion, and a barrier metal layer 19 is formed to cover inside the first through hole 16 and the second through hole 17 in which the inner wall insulation film 18 is formed. The first through hole 16 and the second through hole 17 in which the barrier metal layer 19 is formed are filled with copper (Cu) serving as a conductive layer. A silicon oxide ($SiO_2$) layer is used as the inner wall insulation film 18 and a titanium nitride (TiN) layer is used as the barrier metal layer 19.

In this embodiment, the copper filling the first through hole 16 having the smaller opening diameter forms the silicon through electrode (TSV) 40. On the other hand, the second through hole 17 having the larger opening diameter than the first through hole (TSV through hole) 16 forming the silicon through electrode 40 is filled with copper and forms the silicon through structure (mark structure) 41.

The inner circumference surface of the outer circumference insulation film 12 is formed so as to accord with the outer circumference surface of the second through hole 17, and serves as an etching stopper in an etching process in a process of forming the through hole to prevent a notch from being formed in a direction perpendicular to the etching direction on the surface side of the element section of the second through hole 17 forming the silicon through structure (mark structure) 41 and having the larger opening diameter. As a result, the continuity of the barrier metal layer 19 can be ensured inside the silicon through structure 41. Therefore, even when metal such as Cu is embedded in an upper layer of the barrier metal layer 19, contaminated metal diffusion into the silicon substrate 10 can be suppressed. Accordingly, it is possible to prevent reliability from deteriorating due to element degradation. For example, when a notch is formed, attaching barrier metal may become incomplete in a subsequent process. Therefore, the thickness of the barrier metal layer may be thinned or a defect may occur in some cases. For this reason, in a process after the metal such as Cu is embedded in the upper layer, the metal such as Cu may diffuse in the silicon substrate in some cases, leading to the decrease in reliability due to the contaminated metal diffusion.

The outer circumference insulation film 12 is formed in the same process as the process of forming an element isolation film (STI) 112 of the element section Ra. In the element section Ra, a well 101 isolated by the element isolation film (STI) 112 and serving as a channel region and source/drain diffusion regions 102 disposed in the well 101 are formed, and thus MOSFET is formed by a gate electrode 14 disposed with a gate insulation film 13 interposed therebetween. In addition to this, as the element section Ra, active elements such as transistors and diodes, passive elements such as resistors and capacitors, wirings connecting these elements to each other, memory cells, and the like are disposed. A wiring portion 20 inside the element section Ra has, for example, a multi-layer wiring structure in which wiring layers 21 are laminated with an inter-layer insulation film 22 interposed therebetween.

On the element formation surface 10b side and the rear surface 10a side of the silicon substrate 10, bumps 42 are formed to be connected to the outside.

For example, the silicon substrate 10 is used as the semiconductor substrate, but the invention is not limited to the silicon substrate. Another material such as silicon carbide (SiC) may, of course, be used. The conductor layer filling the first through hole 16 and the second through hole 17 may be formed of one of tungsten (W), nickel (Ni), aluminum (Al), and polycrystalline-silicon in addition to copper.

The material of the outer circumference insulation film 12 is selected from materials having etching selectivity in the process of etching the first through hole 16 and the second through hole 17. On the other hand, the material of the inner wall insulation film 18 is selected from materials for which a metal diffusion length inside the inner wall insulation film 18 is shorter than a metal diffusion length in semiconductor crystal used in the semiconductor substrate, such as silicon crystal. For example, as specific examples of the materials of the inner wall insulation film 18 and the outer circumference insulation film 12, at least one of silicon oxynitride (SiON) and silicon carbonitride (SiCN) in addition to silicon oxide and silicon nitride or a laminated film thereof is selected. SiC is not an insulator, but the same effect as that obtained by using an outer circumference film can be obtained when the etching condition of an etching stopper is selected at the time of forming the through hole.

In addition to titanium and titanium nitride, tantalum can be applied as the material of the barrier metal layer 19.

In the above-described configuration, of the first through hole 16 and the second through hole 17, the second through hole 17 having the larger opening diameter is etched more excessively than the first through hole 16 by the micro-loading effect when RIE is performed for forming the through holes. At this time, since the excessive etching in a direction perpendicular to the etching direction is blocked by the outer circumference insulation film 12, a notch is prevented from being formed considerably compared to a case in which the outer circumference insulation film 12 is not formed. Accordingly, since there is no defect in the barrier metal layer 19 and a continuous film can be obtained inside the second through hole 17, it is possible to suppress the contaminated metal diffusion in the silicon substrate 10 and the reliability deterioration of the element.

In the above-described embodiment, the outer circumference insulation film 12 is not formed in the first through hole 16 in which the silicon through electrode 40 is formed of the first through hole 16 and the second through hole 17. However, when there is a sufficient formation region, the outer circumference insulation film 12 may also be formed in the silicon through electrode 40. Even when a through hole in which the silicon through electrode 40 has a larger opening diameter, an outer circumference insulation film may be formed in the outer circumference of the through hole having the larger opening diameter. Alternatively, the outer circumference insulation film 12 may be formed at all the through hole formation positions. Thus, since the contaminated metal diffusion into the silicon substrate 10 can be suppressed more steadily, the reliability deterioration of the element can be further suppressed. Although the through holes having the same opening diameter are formed, a notch may be formed due to a variance in the opening diameter by the micro-loading effect in a case in which the deep through holes are formed. Even in this case, by forming the outer circumference insulation films 12 at all the through hole formation positions, the notch can be prevented from being formed.

Next, a process of manufacturing the semiconductor device according to this embodiment will be described. FIGS. 4A to 12 are cross-sectional views illustrating the process of manufacturing the semiconductor device. Among FIGS. 4A to 8B, FIGS. 4A, 5A, 6A, 7A, and 8A are cross-sectional views, and FIGS. 4B, 5B, 6B, 7B, and 8B are cross-sectional views taken along the line X-X' of FIGS. 4A, 5A, 6A, 7A, and 8A, respectively.

First, the silicon substrate 10 such as a p-type monocrystalline silicon substrate is prepared, and the pattern of a resist R1 having openings O is formed by photolithography. Here, the silicon substrate 10 can be obtained by applying a resist to a substrate obtained by performing a grinding process and a polishing process on the monocrystalline silicon wafer and by performing pattern exposure (see FIGS. 4A and 4B).

Figure 5A:
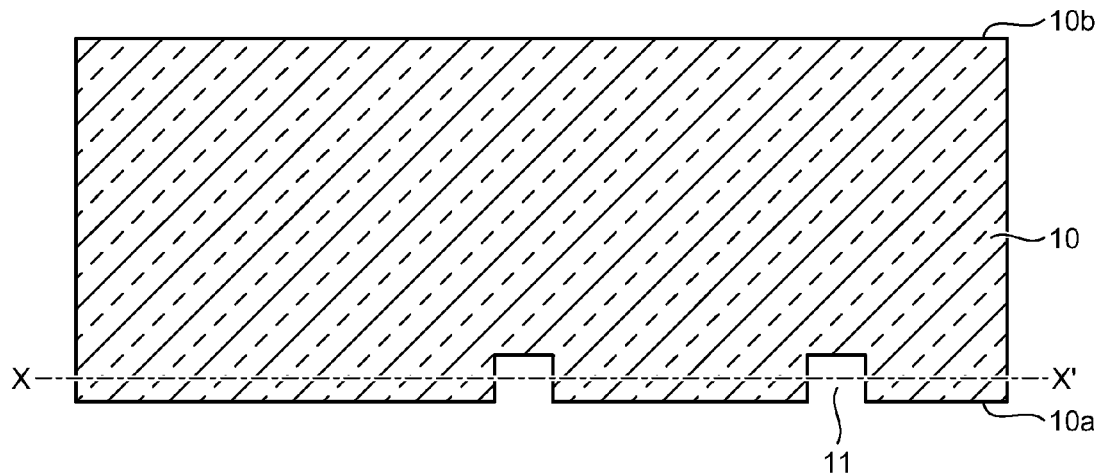
FIGS. 5A and 5B are cross-sectional views illustrating a process of manufacturing the semiconductor device according to the first embodiment.
Figure 5B:
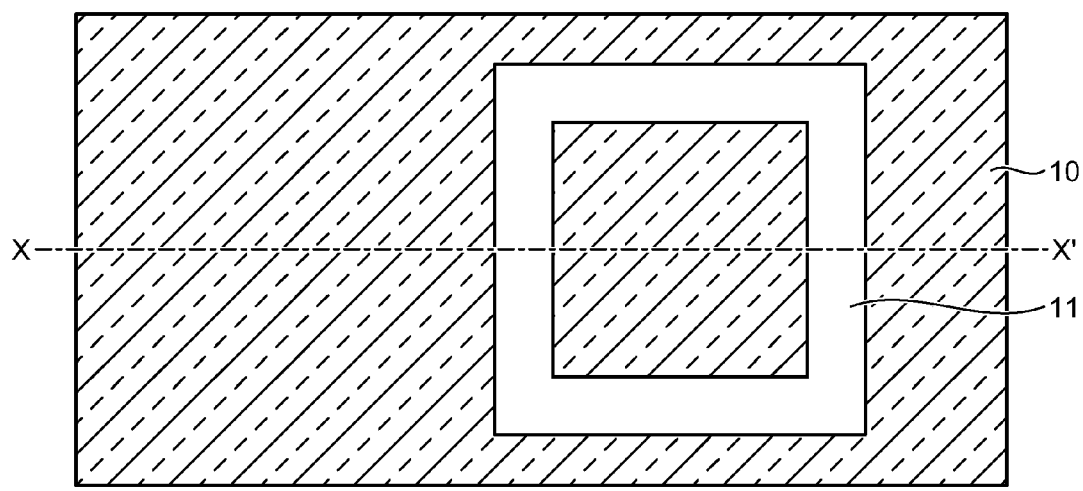

Then, the RIE is performed using the resist R1 as a mask to form trenches 11 and peel off the resist (see FIGS. 5A and 5B). At this time, although not illustrated, a trench used to form the element isolation film (STI) 112 illustrated in FIG. 1 is also formed simultaneously at the same depth.

Figure 6A:
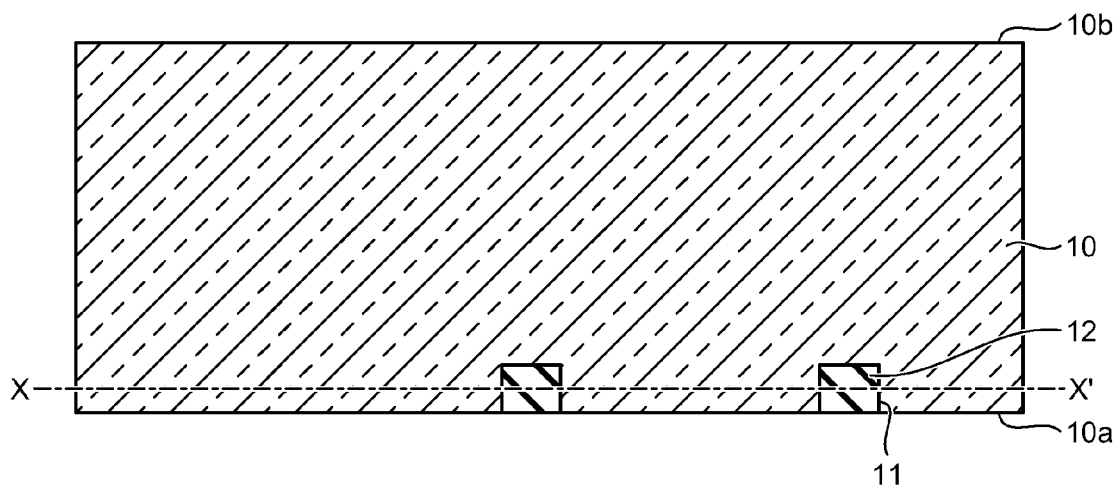
FIGS. 6A and 6B are cross-sectional views illustrating a process of manufacturing the semiconductor device according to the first embodiment.
Figure 6B:
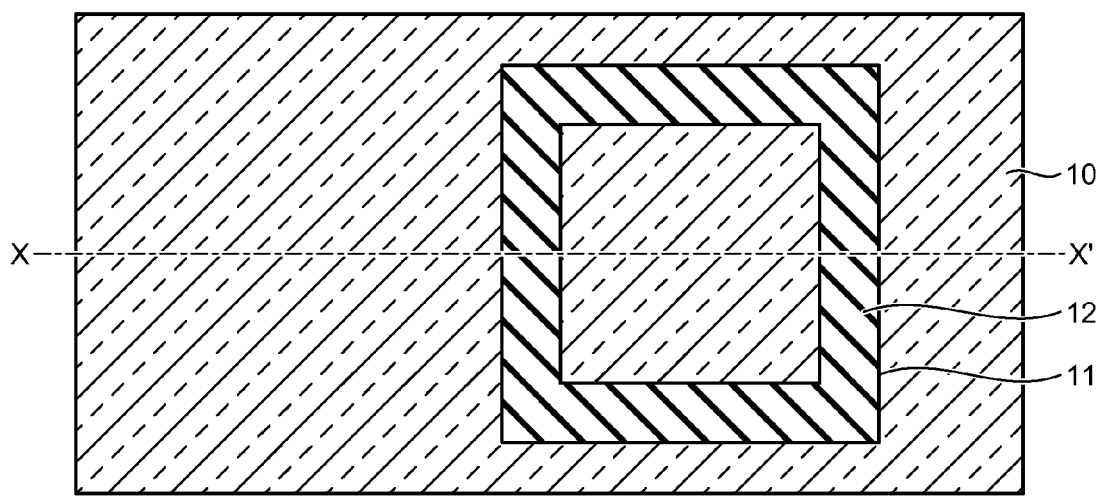

Thereafter, the trench 11 is filled with a silicon oxide layer to form the outer circumference insulation film 12 (see FIGS. 6A and 6B). At this time, although not illustrated, the trench used to form the element isolation film 112 (STI) illustrated in FIG. 1 is filled with a silicon nitride simultaneously with the process of forming the element isolation film. For example, the outer circumference insulation film 12 is formed by forming the silicon nitride by a plasma CVD method and flattening the formed silicon nitride by chemical mechanical polishing (CMP). However, the outer circumference insulation film 12 may be formed of another insulation film such as a silicon oxide film and may be formed by a film forming method appropriately selected.

Next, although not illustrated, the well 101, the source/drain diffusion regions 102, and the like are formed on the surface of the silicon substrate 10 surrounded by the element isolation film 112 to form the active elements such as transistors and diodes and passive elements such as resistors and capacitors that form the element section Ra, for example, by forming the MOSFET.

Figure 7A:
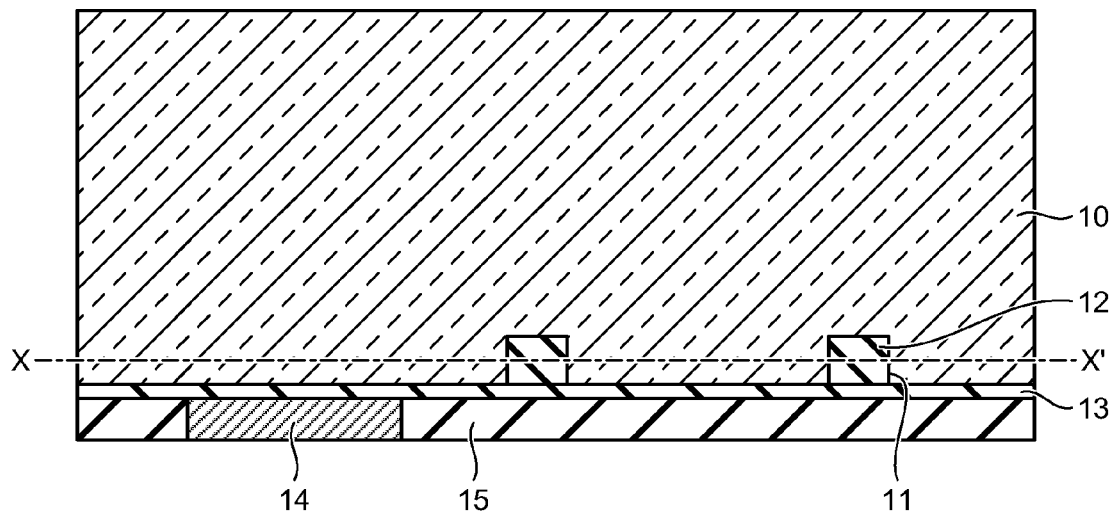
FIGS. 7A and 7B are cross-sectional views illustrating a process of manufacturing the semiconductor device according to the first embodiment.
Figure 7B:
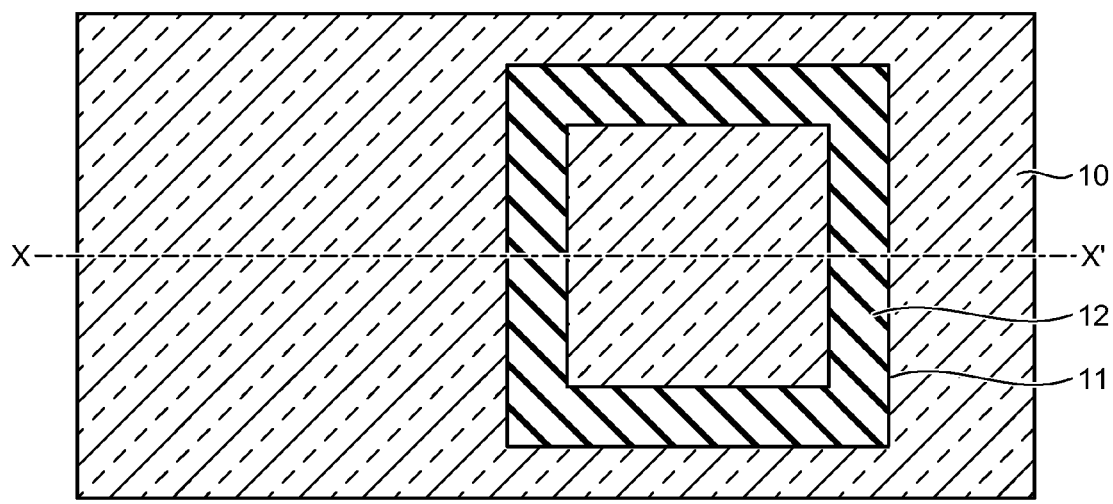

Then, the gate insulation film 13 formed of a silicon oxide layer is formed to form a laminated film of silicide and polycrystalline silicon serving as the gate electrode 14 (see FIGS. 7A and 7B). The insulation film 15 is formed on the element formation surface 10b side of the silicon substrate 10, and the wiring layer 21 formed of aluminum or the like and the inter-layer insulation film 22 are alternately formed (see FIG. 1), although not illustrated in the cross-sectional view. In the wiring portion 20 inside the element section Ra, the wiring layer 21 has a multi-layer wiring structure in which the inter-layer insulation film 22 is interposed.

Figure 8A:
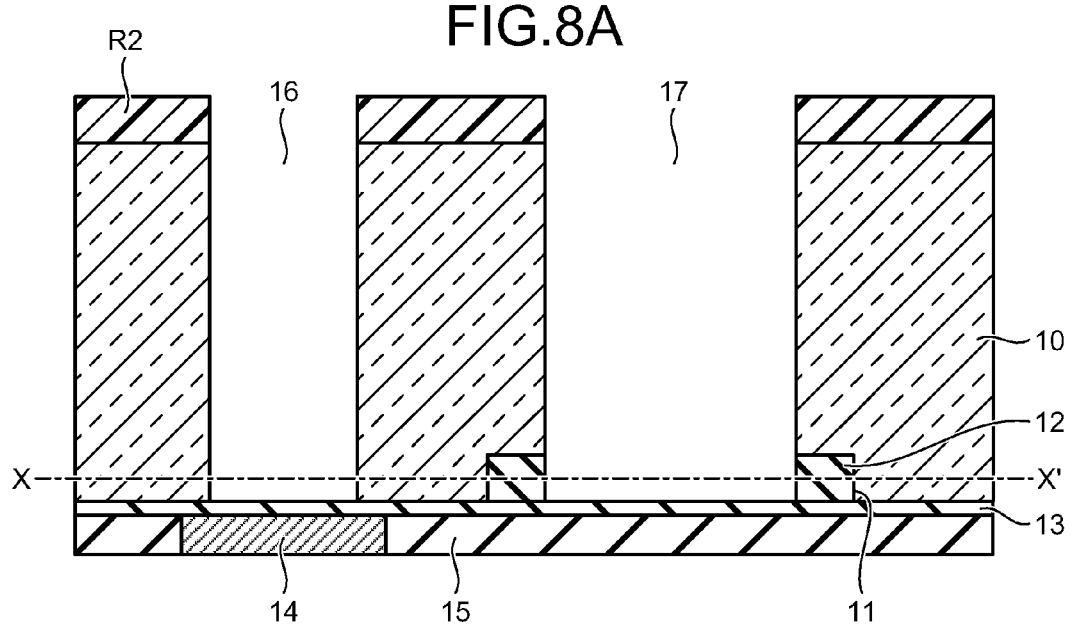
FIGS. 8A and 8B are cross-sectional views illustrating a process of manufacturing the semiconductor device according to the first embodiment, and 8A is a cross-sectional view
Figure 8B:
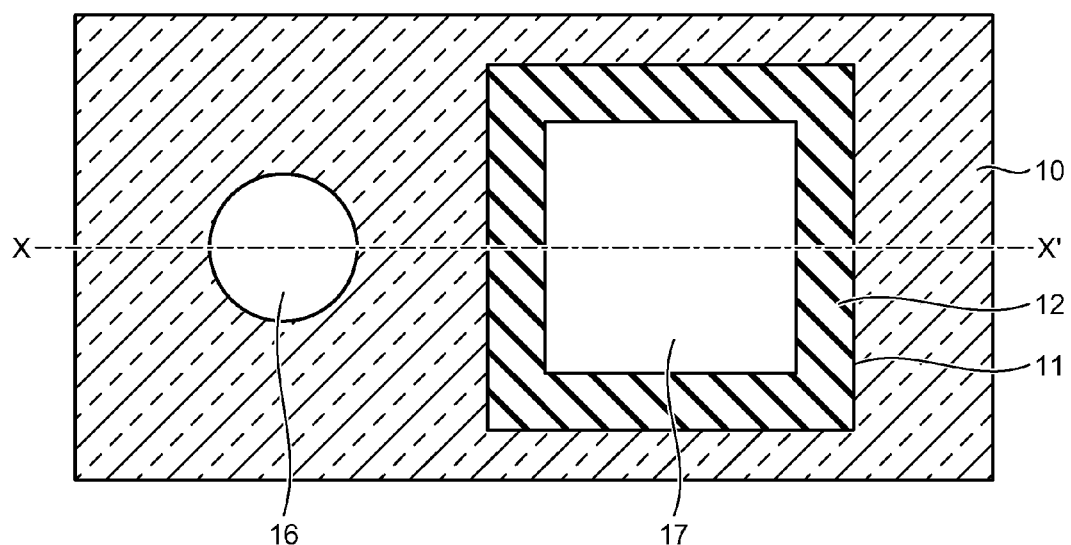

The pattern of a resist R2 is formed on the rear surface 10a side of the silicon substrate 10 by photolithography. As illustrated in FIGS. 8A and 8B, RIE is performed using the pattern of the resist R2 as a mask to form the first through hole 16 and the second through hole 17 having the different opening diameters. Although not illustrated here, a plurality of through holes are formed. At this time, of the first through hole 16 and the second through hole 17, the second through hole 17 having the larger opening diameter, is etched more excessively than the first through hole 16 by the micro-loading effect when the RIE is performed to form the through holes. In this embodiment, however, since the excessive etching in a direction perpendicular to the etching direction is blocked by the outer circumference insulation film 12, a notch is prevented from being formed considerably compared to the case in which the outer circumference insulation film 12 is not formed.

Figure 9:
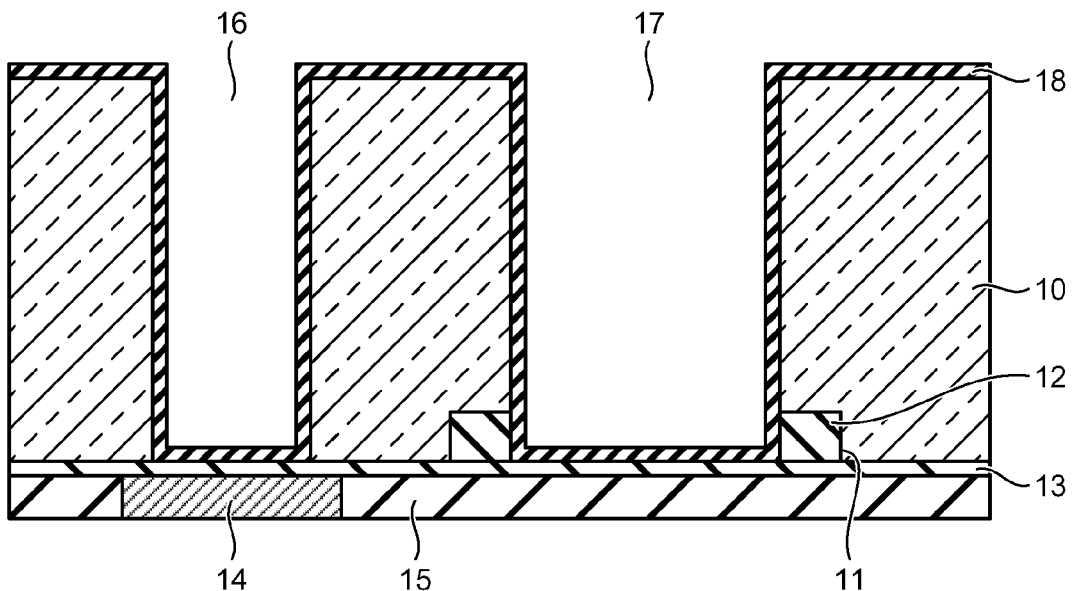
FIG. 9 is a cross-sectional view illustrating a process of manufacturing the semiconductor device according to the first embodiment.

Thereafter, as illustrated in FIG. 9, the resist is peeled to form the silicon oxide layer as the inner wall insulation film 18 by a CVD method. Here, the inner wall insulation film 18 is formed by a plasma CVD method in which a step coverage is good.

Figure 10:
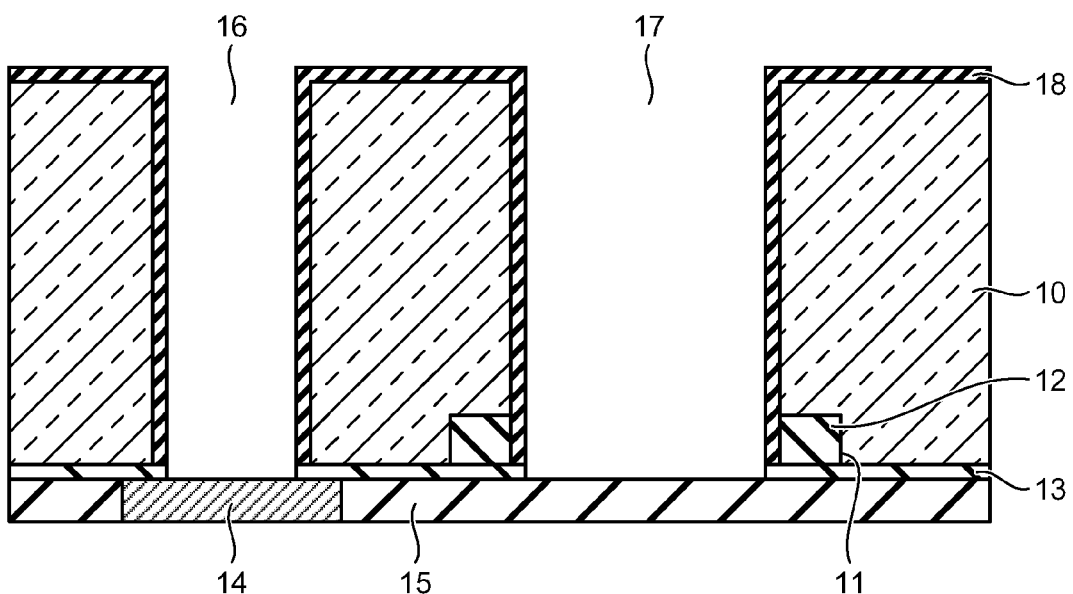
FIG. 10 is a cross-sectional view illustrating a process of manufacturing the semiconductor device according to the first embodiment.

Subsequently, as illustrated in FIG. 10, the inner wall insulation film 18 and the gate insulation film 13 of the bottoms of the first through hole 16 and the second through hole 17 are removed by anisotropic etching. At this time, the inner wall insulation film 18 on the side of the rear surface 10a side of the silicon substrate 10 is also etched away by a certain amount.

Figure 11:
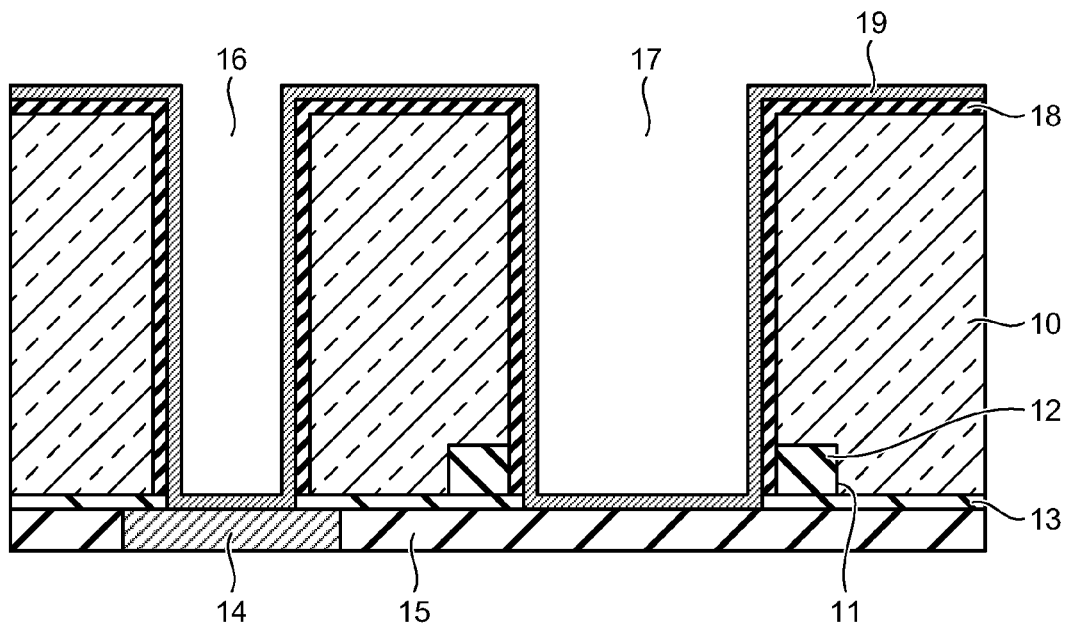
FIG. 11 is a cross-sectional view illustrating a process of manufacturing the semiconductor device according to the first embodiment.
Figure 12:
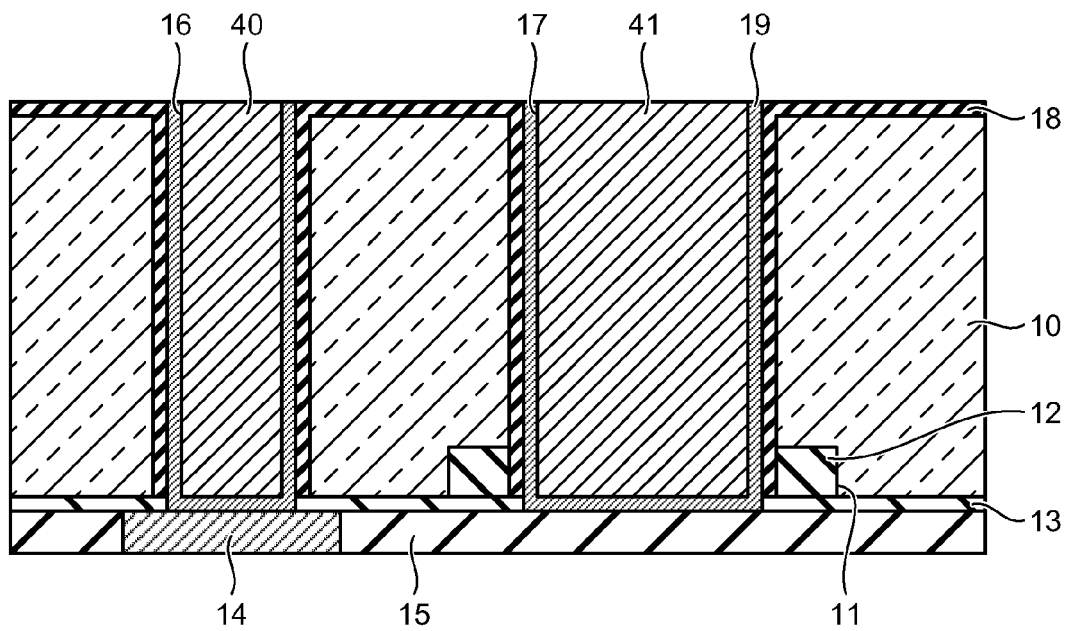
FIG. 12 is a cross-sectional view illustrating a process of manufacturing the semiconductor device according to the first embodiment.

Thereafter, the barrier metal layer 19 formed of a titanium nitride layer is formed by a sputtering method (see FIG. 11).

Finally, a conductive layer is formed on the rear surface 10a of the silicon substrate 10 and inside the first through hole 16 and the second through hole 17 with the barrier metal layer 19 interposed therebetween. For example, the conductive layer is formed by an electrolytic plating method or a plasma CVD. Then, an excessive portion of the conductive layer formed outside the first through hole 16 and the second through hole 17 and an excessive portion of the barrier metal layer 19 formed on the rear surface 10a of the silicon substrate 10 are removed by a CMP. Thus, the silicon through electrode 40 connected to the element section Ra is formed inside the first through hole 16. Then, the silicon through structure (mark structure) 41 is formed inside the second through hole 17 (see FIG. 12).

According to this embodiment, even when the plurality of through holes having different opening diameters are formed, a notch can be prevented from being formed due to the presence of the outer circumference insulation film 12 installed in the second through hole 17 having the larger opening diameter (larger cross-sectional area) by the micro-loading effect. Accordingly, the barrier metal layer can be continuously formed in the entire region of the second through hole 17. Thus, since the contaminated metal diffusion into the silicon substrate 10 can be suppressed, it becomes possible to suppress the reliability deterioration of the element.

In reality, at the same time as the formation of the STI, the outer circumference insulation film is formed on the element formation surface of the silicon substrate 10 so as to surround the outer circumference of the region in which the second through hole 17 is formed, and then the element region is formed. Then, the silicon substrate 10 is adhered to a supporting substrate and the silicon substrate 10 is scraped from the rear surface side of the element formation surface to thin the silicon substrate 10. Then, the first through hole 16 and the second through hole 17 are formed from the rear surface side of the silicon substrate 10 by the RIE processing. The inner wall insulation film 18, the barrier metal layer 19, and the conductive layer are filled by various methods. In this way, the silicon through electrode 40 and the mark structure 41 can be obtained. Then, the semiconductor devices can be obtained by performing dicing along dicing lines DL illustrated in FIG. 2 and dividing the element into pieces. The mark structure 41 is formed in a corner region r0 of the pieces (chips) to be used as a joining mark at the mounting time.

Figure 26:
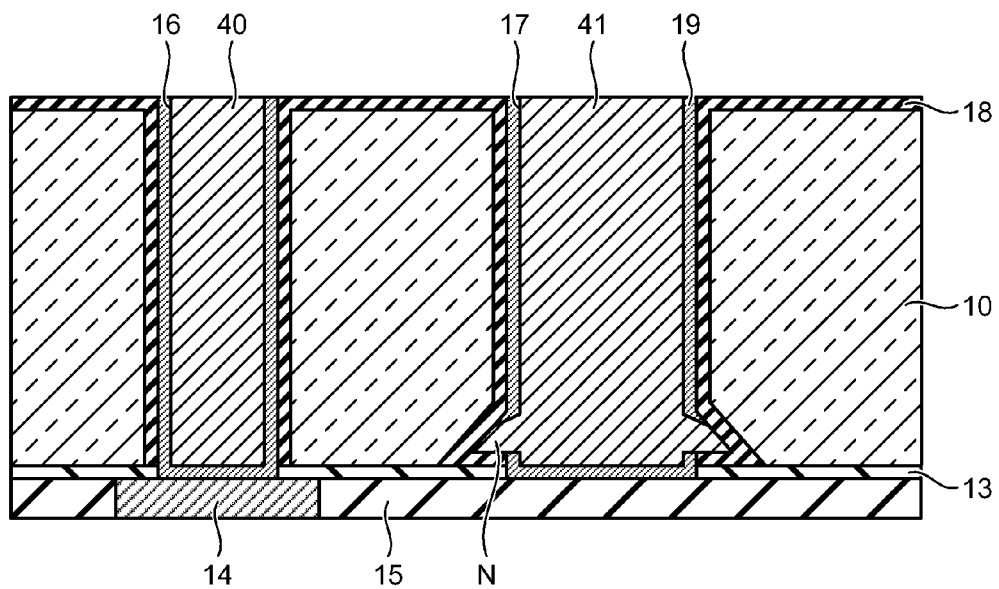
FIG. 26 is a cross-sectional view illustrating a semiconductor device according to a comparative example.

To make a comparison, a semiconductor device according to a comparative example of FIG. 26 will be described. As illustrated in FIG. 26, the silicon through electrode (TSV) 40 and the silicon through structure 41 having the larger cross-sectional area than the TSV are present at the same layer in some cases. At this time, the second through hole 17 of the silicon through structure 41 is etched more excessively than the TSV by the micro-loading effect when the reactive ion etching (RIE) is performed. In such a structure, when the silicon through structure is etched more excessively by the RIE, the bottom side of the silicon through structure having the larger cross-sectional area than the TSV is etched in a direction perpendicular to an etching direction (notching). At this time, to a notched portion N, the barrier metal layer 19 is incompletely attached in a subsequent process, and thus the thickness of the barrier metal layer 19 may be thinned or a defect may occur in some cases. For this reason, during a process after a process of embedding a metal layer such as Cu in an upper layer of the barrier metal layer, the metal such as Cu may diffuse in the silicon substrate, leading to the decrease in reliability in some cases.

(Second Embodiment)

Figure 13:
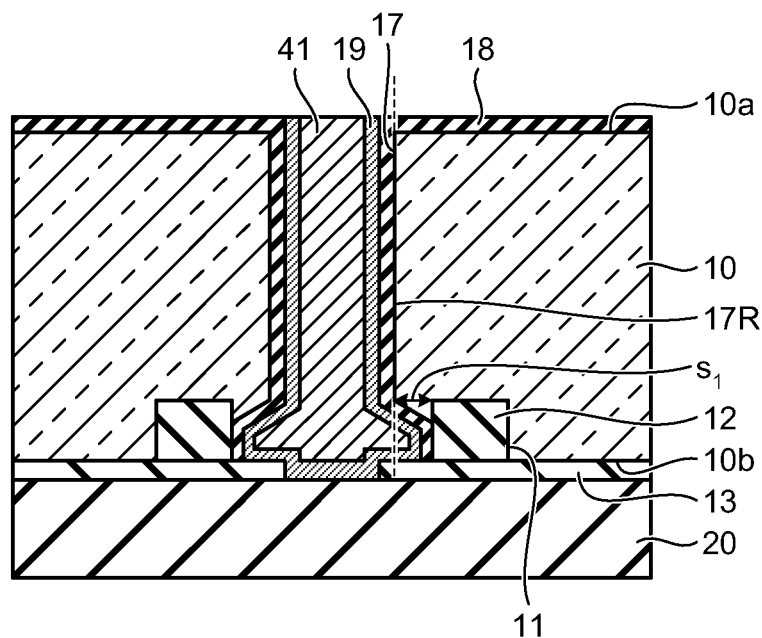
FIG. 13 is a cross-sectional view illustrating the overall configuration of a semiconductor device according to a second embodiment.

FIG. 13 is an expanded cross-sectional view illustrating the overall configuration of main units of a silicon through structure 41 of a semiconductor device according to a second embodiment.

In the semiconductor device according to the second embodiment, the inner circumference surface of an outer circumference insulation film 12 is located to the outside by a distance s1 from an outer circumference surface 17R of a second through hole 17. Since the configuration of the other units is the same as that of the semiconductor device described above in the first embodiment, the description thereof will not be repeated. The same reference numerals are given to the same units. Since the amount of formed notch is different depending on a cross-sectional area ratio with the through hole, the thickness of silicon to be etched to form a through hole, a condition of the RIE, or the like, it is difficult to define the upper limit value of the distance s1. However, since the specification of an alignment deviation is about ±1 μm, the distance s1 needs to be about 1 μm or more to completely deal with the alignment deviation.

A first through hole 16 has an opening diameter different from the second through hole 17. The outer circumference insulation film 12 is formed at a position at which the second through hole 17 is surrounded on the outside by the distance s1 from the outer circumference surface 17R which is the outer circumference of at least the second through hole 17 having the larger opening diameter between the first through hole 16 and the second through hole 17. The outer circumference surface 17R of the second through hole 17 is the outer circumference surface of the second through hole 17 on the rear surface of the silicon substrate 10. For example, the outer circumference surface 17R is the actual outer circumference surface of the second through hole 17 and is an outer circumference surface in a region in which the size of the through hole is substantially constant.

Next, a process of manufacturing the semiconductor device according to this embodiment will be described. FIGS. 14A,14B to 18 are cross-sectional views illustrating the process of manufacturing the semiconductor device. Among FIGS. 14A,14B to 15A,15B, FIGS. 14A, and 15A are cross-sectional views, and FIGS. 14B, and 15B are cross-sectional views taken along the line X-X' of FIGS. 14A, and 15A, respectively.

The processes to the process of forming the outer circumference insulation film 12 are the same as those of the above-described first embodiment. However, the outer circumference insulation film 12 is formed to the outside by a distance s1, compared to the case of the above-described first embodiment, and thus a frame having each side larger than by the length of 2s1 is formed. As in the processes illustrated in FIGS. 4A,4B to 6A,6B, a trench 11 is formed on the outside by the distance s1, compared to the case of the above-described first embodiment, to form the outer circumference film in the process of forming the element isolation film (STI) 112 illustrated in FIG. 1 in the silicon substrate 10 such as the p-type monocrystalline silicon substrate or the like. Then, the trench 11 is filled with a silicon nitride layer to form the outer circumference insulation film 12.

Next, although not illustrated, a well 101, source/drain diffusion regions 102, and the like are formed on the surface of the silicon substrate 10 surrounded by the element isolation film 112 to form the active elements such as transistors and diodes and passive elements such as resistors and capacitors that form the element section Ra, for example, by forming the MOSFET.

Figure 14A:
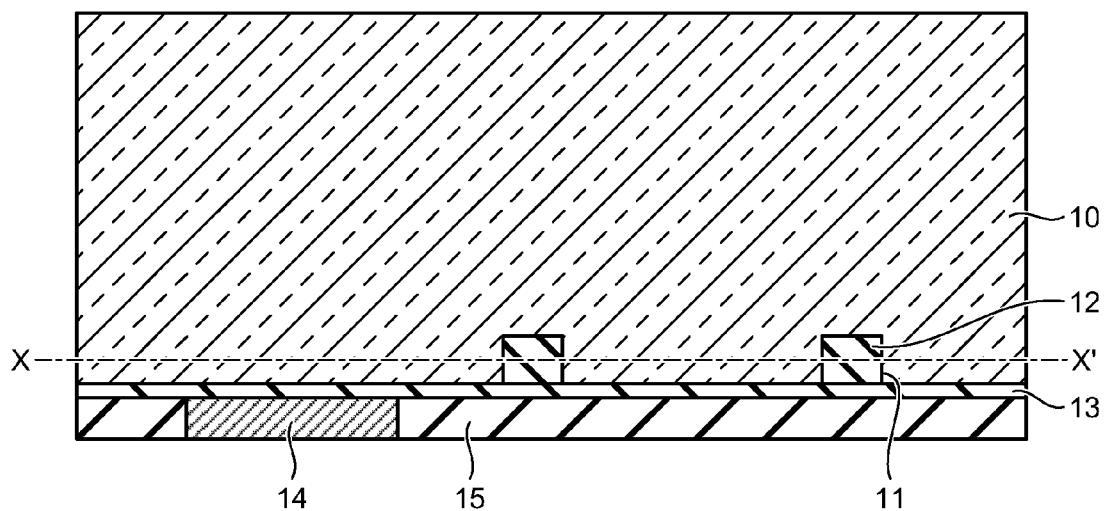
FIGS. 14A and 14B are cross-sectional views illustrating a process of manufacturing the semiconductor device according to the second embodiment.
Figure 14B:
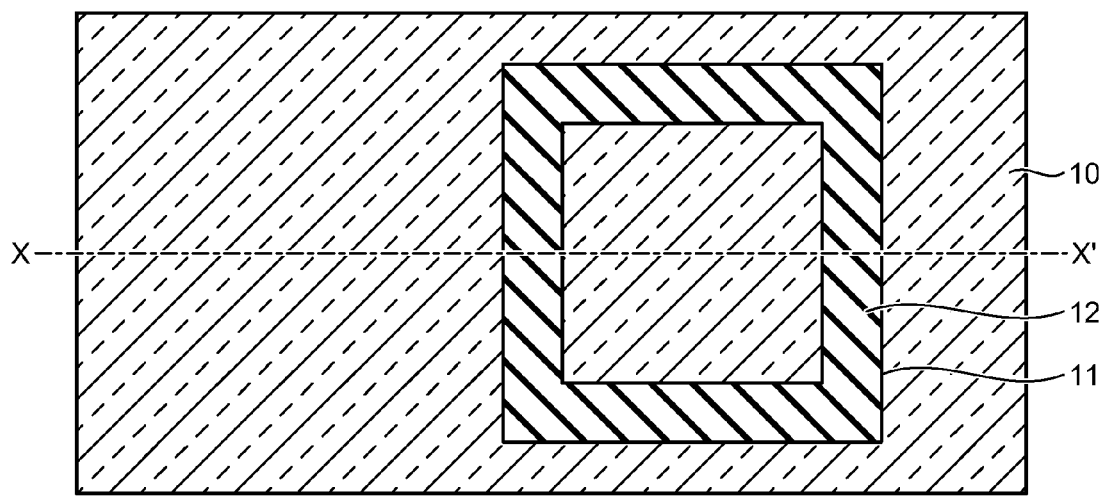

Then, the gate insulation film 13 formed of a silicon oxide layer is formed to form a polycrystalline silicon layer serving as the gate electrode 14 (see FIGS. 14A and 14B). The insulation film 15 is formed on the element formation surface 10b side of the silicon substrate 10, and the wiring layer 21 formed of aluminum or the like and the inter-layer insulation film 22 are alternately formed (see FIG. 1), although not illustrated in the cross-sectional view. In the wiring portion 20 inside the element section Ra, the wiring layer 21 has a multi-layer wiring structure in which the inter-layer insulation film 22 is interposed.

Figure 15A:
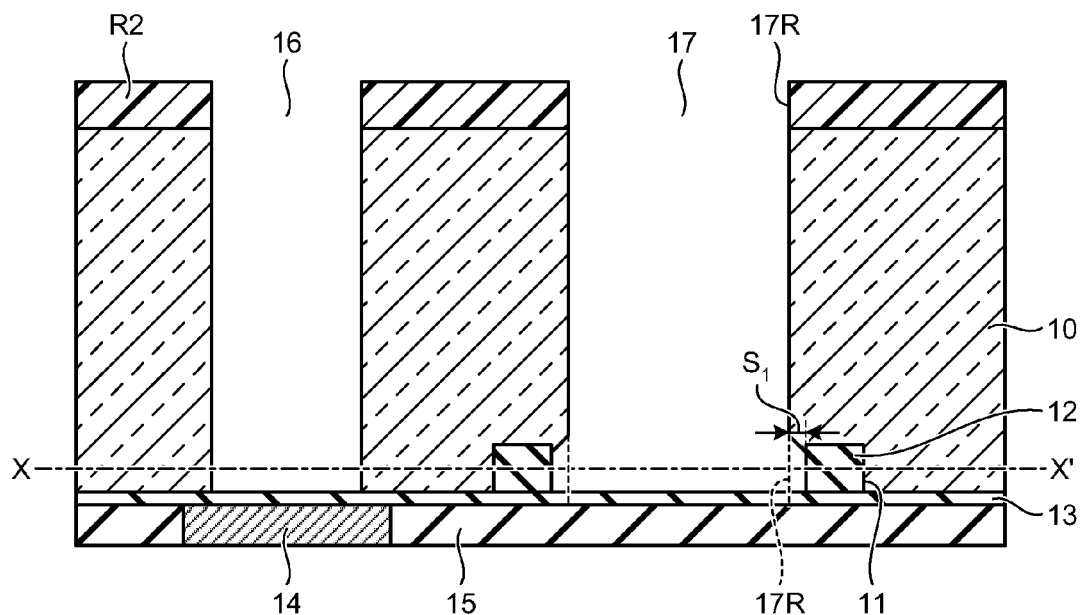
FIGS. 15A and 15B are cross-sectional views illustrating a process of manufacturing the semiconductor device according to the second embodiment.
Figure 15B:
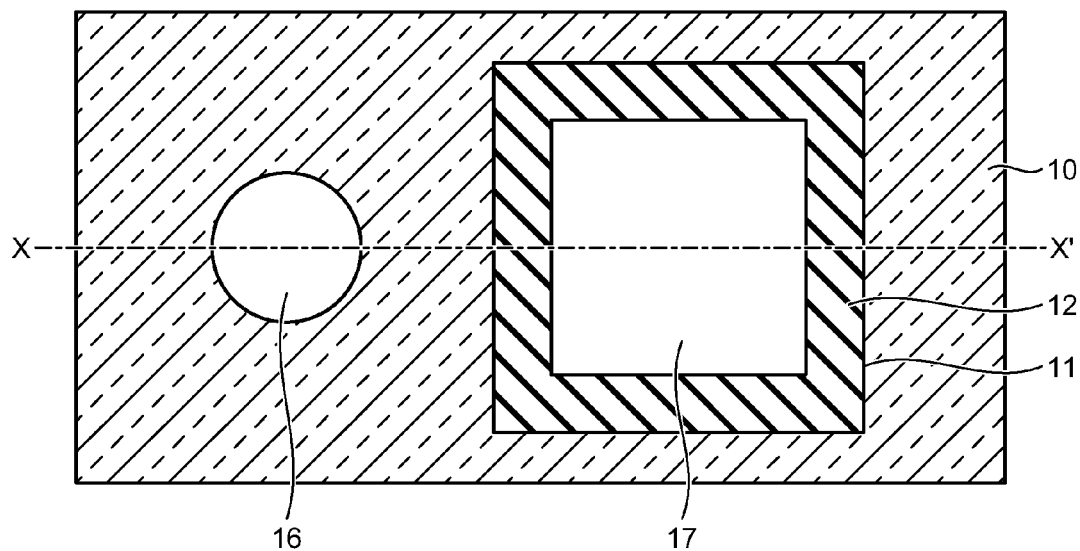

As illustrated in FIGS. 15A and 15B, the pattern of a resist R2 is formed on the rear surface 10a side of the silicon substrate 10 by photolithography, and RIE is performed using the pattern of the resist R2 as a mask to form the first through hole 16 and the second through hole 17 having the different opening diameters. Although not illustrated here, a plurality of through holes are formed as in the case of the first embodiment. At this time, of the first through hole 16 and the second through hole 17, the second through hole 17 having the larger opening diameter is etched more excessively than the first through hole 16 by the micro-loading effect when the RIE is performed to form the through holes. In this embodiment, however, since the second through hole 17 is expanded to the outside by the distance s1 in a direction perpendicular to the etching direction, the excessive etching is blocked by the outer circumference insulation film 12 formed to the outside by the distance s1 from the outer circumference surface 17R in the opening end of the second through hole 17.

Figure 16:
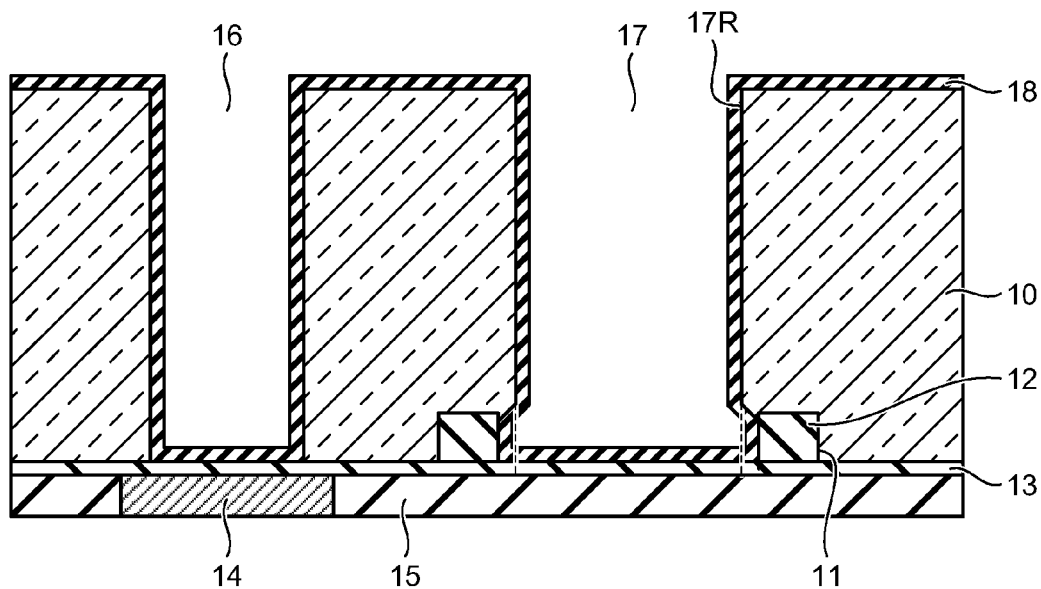
FIG. 16 is a cross-sectional view illustrating a process of manufacturing the semiconductor device according to the second embodiment.

Thereafter, as illustrated in FIG. 16, the resist R2 is peeled to form the silicon oxide layer as the inner wall insulation film 18 by a CVD method. Here, the inner wall insulation film 18 is formed by a plasma CVD method in which a step coverage is good to cover a tapered surface expanded gently to the outside.

Figure 17:
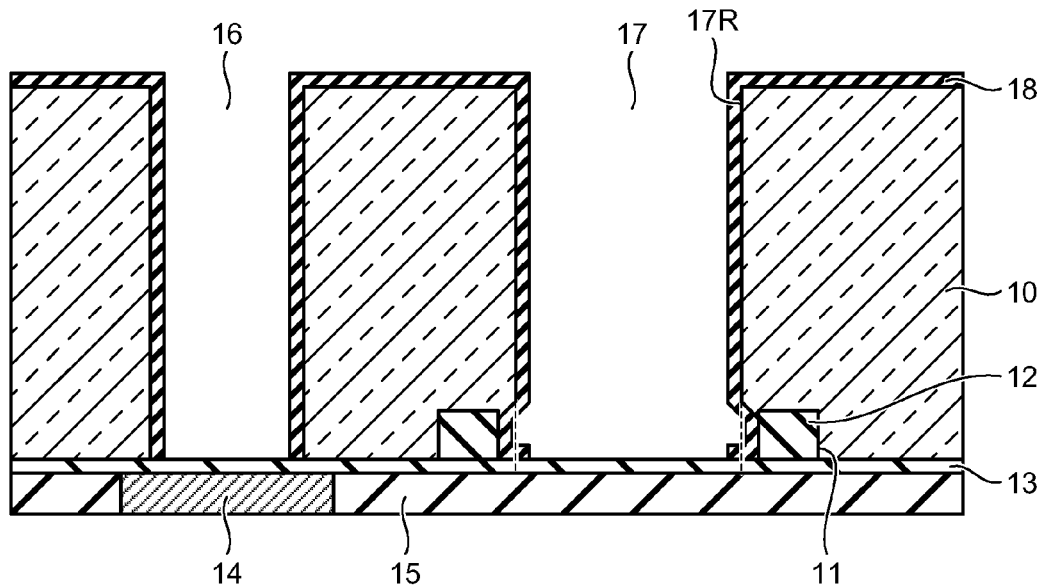
FIG. 17 is a cross-sectional view illustrating a process of manufacturing the semiconductor device according to the second embodiment.

Subsequently, as illustrated in FIG. 17, the inner wall insulation film 18 and the gate insulation film 13 of the bottoms of the first through hole 16 and the second through hole 17 are removed by anisotropic etching. At this time, the inner wall insulation film 18 on the side of the rear surface 10a of the silicon substrate 10 is also etched away by a certain amount.

Figure 18:
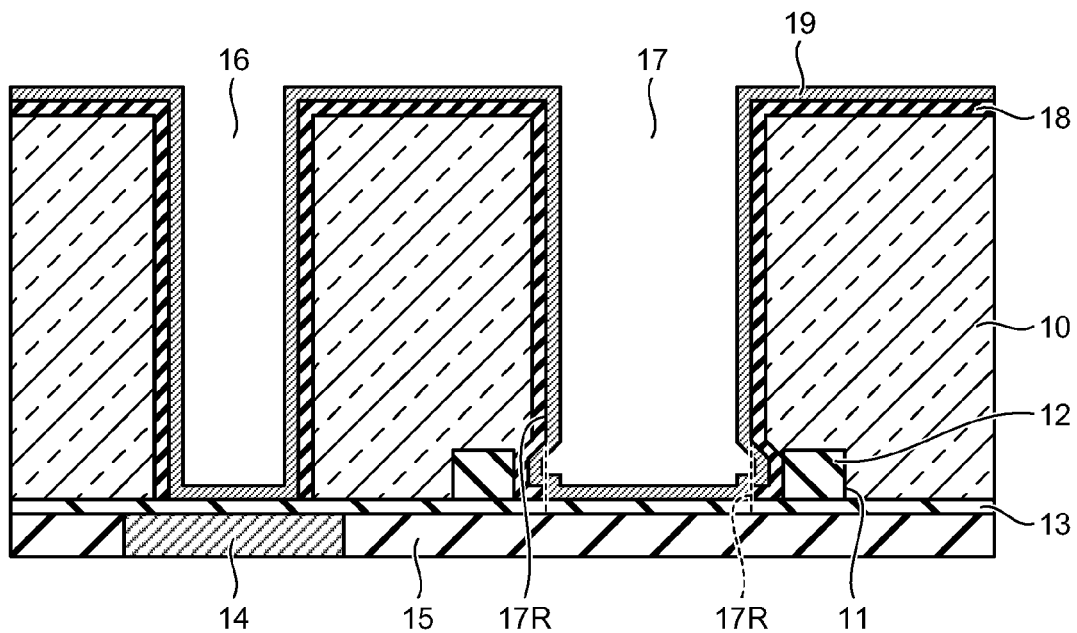
FIG. 18 is a cross-sectional view illustrating a process of manufacturing the semiconductor device according to the second embodiment.

Thereafter, the barrier metal layer 19 formed of a titanium nitride layer is formed by a sputtering method (see FIG. 18).

According to this embodiment, even when the plurality of through holes having different opening diameters are formed as well as the two kinds of the first through hole 16 and the second through hole 17, a notch can be prevented from being formed due to the presence of the outer circumference insulation film 12 installed in the through hole having the larger opening diameter (larger cross-sectional area) by the micro-loading effect. Accordingly, the barrier metal layer 19 can be continuously formed in the entire region of the through hole. Thus, even when the through hole is filled with the metal layer such as a copper layer, it becomes possible to suppress the reliability deterioration of the element since the contaminated metal diffusion into the silicon substrate 10 can be suppressed.

Thus, on the element formation surface 10b side of the silicon substrate 10 coming into contact with the gate insulation film 13, the outer circumference insulation film 12 is disposed in advance at the position spaced to the outside by the distance s1 from the outer circumference to surround the outer circumference of the silicon through structure 41 formed as the mark structure formed in the subsequent process. At this time, the outer circumference insulation film 12 is disposed so that the inner circumference surface of the outer circumference insulation film 12 located to the outside from the silicon through structure 41 does not come into contact with the entire surface of the second through hole 17 of the silicon through structure 41.

At this time, in the RIE in which the through holes are formed, the through holes such as the first through hole 16 and the second through hole 17 having the different opening diameters are concurrently formed. Further, the second through hole 17 forming the silicon through structure and having the larger opening diameter is excessively etched in a direction perpendicular to the etching direction than the TSV by the micro-loading effect when the RIE is performed. At this time, the excessive etching in the horizontal direction is blocked by the outer circumference insulation film 12 and a small amount of notch is formed, but the notch is prevented from being considerably formed, compared to the related art.

At this time, the space of the distance s1 is present between the outer circumference insulation film 12 and the position of the silicon through structure 41 in the second through hole 17 in terms of design. Therefore, even when the position of the silicon through structure 41 is deviated, a pattern is formed inside the enclosure of the outer circumference insulation film 12 even in the silicon through structure 41, and thus a notch is prevented from being formed. Accordingly, since the barrier metal layer 19 formed with the inner wall insulation film 18 interposed therebetween is formed on the side wall of the through hole which is a surface having a gently decreasing unevenness, the barrier metal layer 19 can be continuously formed in the entire region of the second through hole 17. Thus, since the contaminated metal diffusion into the silicon substrate 10 can be suppressed, it becomes possible to suppress the reliability deterioration of the element.

In the structure described in this embodiment, the notch prevention effect is less achieved than in the structure described in the first embodiment. However, there is an adjustment allowance for the mask in the lithography process at the time of forming the pattern of the resist R2 used to form the through hole. That is, in the first embodiment, there is a probability that a notch may be newly formed on the outer circumference insulation film, when the adjustment deviation may occur in the lithography process at the time of forming the pattern of the resist R2 used to form the through hole or the position of the bottom of the second through hole 17 of the silicon through structure 41 be slightly deviated from the designed position. In this embodiment, however, a large deviation margin is provided by forming the space between the outer circumference insulation film 12 and the position of the silicon through structure 41 such as the mark structure having the larger cross-sectional area than the silicon through electrode 40 in terms of design.

(Third Embodiment)

Figure 19:
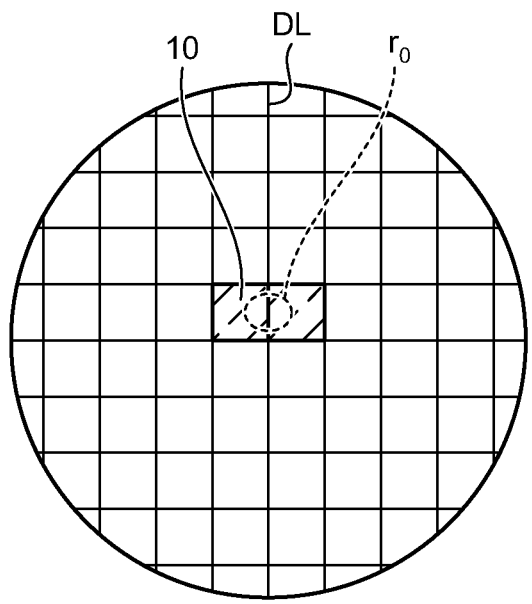
FIG. 19 is a view illustrating the position of a semiconductor device on a wafer according to a third embodiment.
Figure 20:
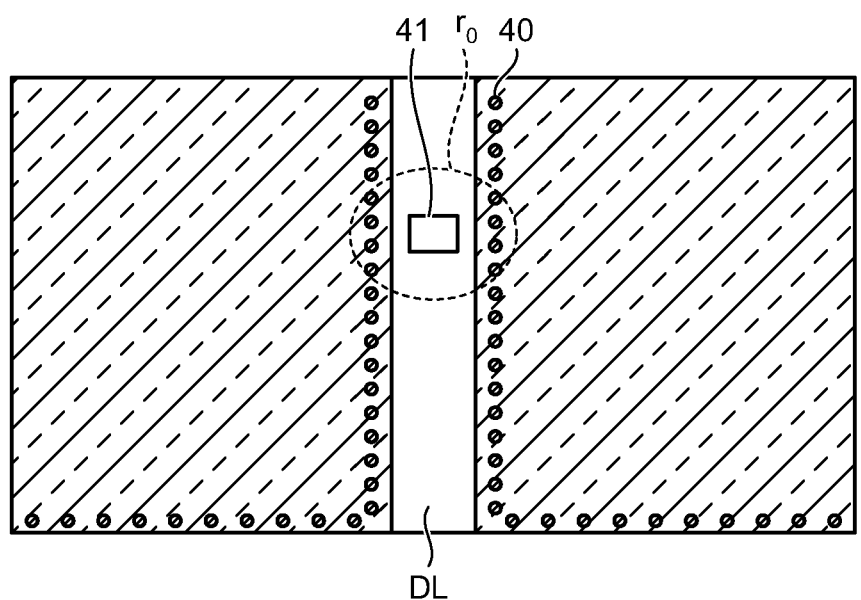
FIG. 20 is an expanded diagram illustrating main units of FIG. 19.
Figure 21:
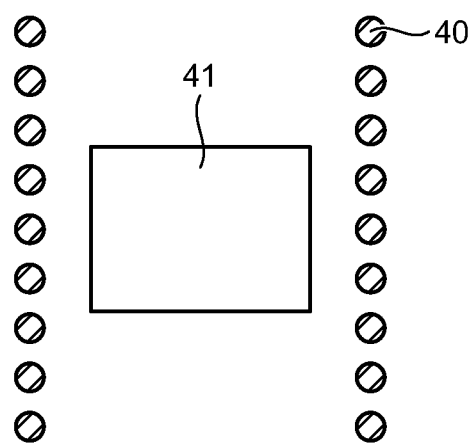
FIG. 21 is a further expanded diagram illustrating the main units of FIG. 20.

FIGS. 19 to 21 are views illustrating the overall configuration of the silicon through structure 41 of the semiconductor device according to a third embodiment. FIG. 19 is a view illustrating the position of the semiconductor device on the wafer. FIG. 20 is an expanded view illustrating the main units of FIG. 19. FIG. 21 is a further expanded view illustrating the main units of FIG. 20.

In the semiconductor device according to the first embodiment, the mark structure formed by the silicon through structure 41 is disposed in the corner region of each chip. In this embodiment, however, the mark structure is disposed in a region r0 on the dicing line DL. In this case, the mark structure is cut away in a dicing process. However, since there is no concern that a notch is formed by providing the outer circumference insulation film 12 as in this embodiment, the element section can be reliably protected. Accordingly, since a mark structure forming region can be disposed up to the maximum dicing line, a margin for forming the mark structure on the dicing line DL can be decreased. Since the configuration of the other units is the same as that of the semiconductor device described above in the first embodiment, the description will not be repeated. The same reference numerals are given to the same units.

(Fourth Embodiment)

Figure 22:
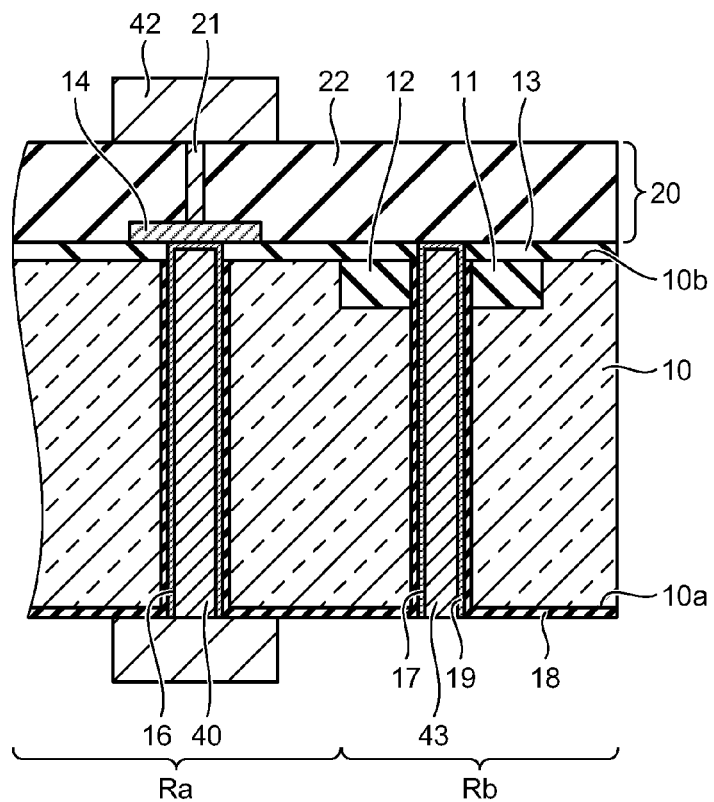
FIG. 22 is a view illustrating the overall configuration of main units of a semiconductor device according to a fourth embodiment and is a cross-sectional view taken along the line A-A of FIG. 23.
Figure 23:
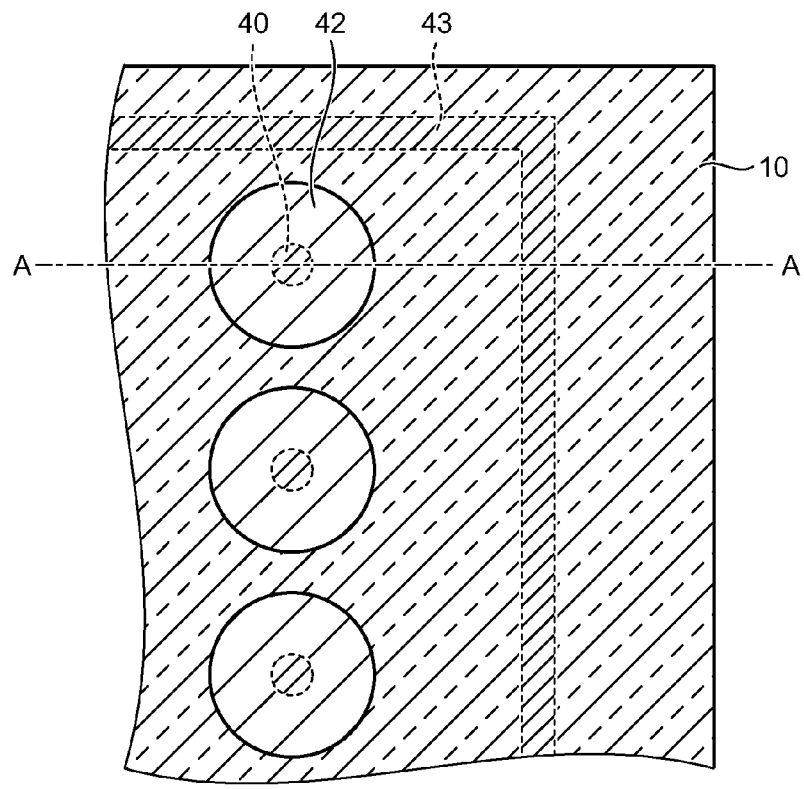
FIG. 23 is a top view schematically illustrating the semiconductor device according to the fourth embodiment.

FIG. 22 is a cross-sectional view illustrating the overall configuration of main units of a semiconductor device according to a fourth embodiment. FIG. 22 is the sectional view taken along the line A-A of FIG. 23. FIG. 23 is a top schematical view of FIG. 22.

In the first to third embodiments, the silicon through structure 41 forming the mark structure has been described. This configuration, however, can be applied to a case in which a silicon through structure 43 having a guard ring structure formed in a peripheral section Rb of an element section Ra is formed. The fourth embodiment is an example applied to the silicon through structure 43 having the guard ring structure and is the same as the first embodiment described in FIG. 1. However, when viewed from the cross-sectional surface, the width of the second through hole 17 of the silicon through structure 43 is less than that of the first through hole 16 of the silicon through hole electrode 40. However, apparent from the top schematical view of FIG. 23, the second through hole 17 is formed in the peripheral section Rb so as to surround the element section Ra of the silicon substrate (semiconductor chip) 10. Accordingly, the opening area is considerably greater than that of the first through hole 16. Since the configuration of the other units is the same as that of the semiconductor device described above in the first embodiment, the description will not be repeated. The same reference numerals are given to the same units.

The semiconductor device according to the fourth embodiment includes a silicon substrate 10 as a semiconductor substrate in which an element (not illustrated) such as MOSFET is formed. The semiconductor device includes: an element section Ra including a silicon through electrode (TSV) 40; and the silicon through structure 43 which is formed in a ring shape to surround the outer circumference of the peripheral section Rb of the element section Ra. The silicon through structure 43 is configured as a guard ring structure. The semiconductor device includes a first through hole 16 and a second through hole 17 that penetrate from a rear surface 10a side of an element formation surface 10b of the silicon substrate 10 to the element formation surface 10b. The first through hole 16 and the second through hole 17 are filled with copper, and therefore silicon through electrode 40 and the silicon through structure 43 are formed, respectively. The opening diameter of the first through hole 16 is different from that of the second through hole 17. An outer circumference insulation film 12 is formed on the side wall of the bottom of the second through hole 17 so as to surround the outer circumference of the second through hole 17 having the larger opening diameter between the first through hole 16 and the second through hole 17.

The silicon through structure 43 forming the guard ring structure has a small opening width. However, the peripheral section Rb is formed to surround the element section Ra of the silicon substrate (semiconductor chip) 10, the opening area is considerably large. Therefore, when the second through hole 17 of the silicon through structure 43 is formed in the same process as that of the silicon through electrode 40, the micro-loading effect is increased. However, by disposing the outer circumference insulation film, a notch is not formed and the silicon through structure having high reliability can be formed.

Not only the guard ring structure has a ring shape surrounding the element section, but a C shape, an O shape, or the like can also be selected appropriately.

(Fifth Embodiment)

Figure 24:
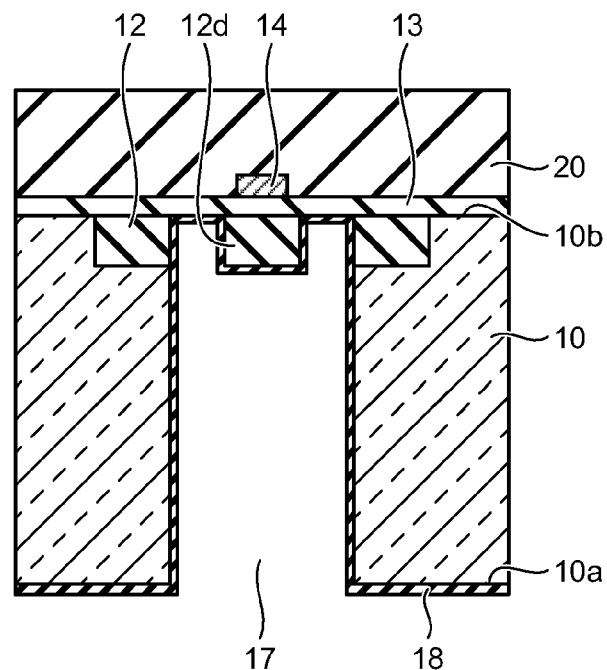
FIG. 24 is a cross-sectional view illustrating the overall configuration of main units in a method of manufacturing a semiconductor device according to a fifth embodiment.
Figure 25:
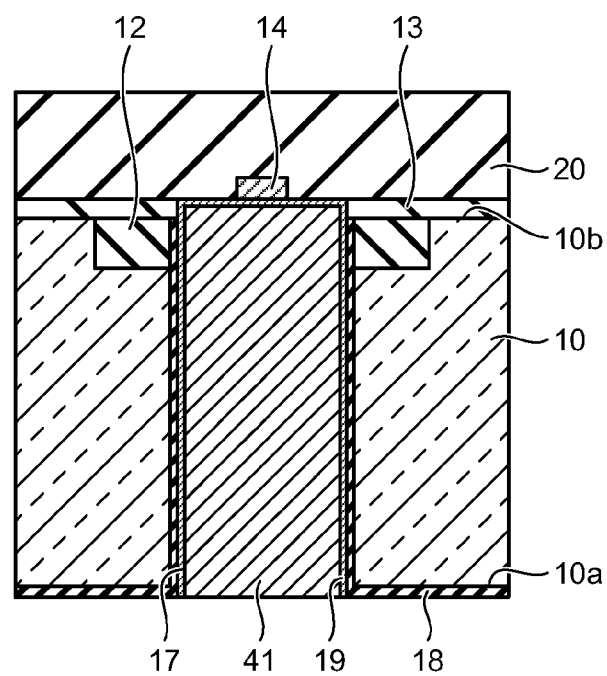
FIG. 25 is a cross-sectional view illustrating the overall configuration of the main units in the method of manufacturing the semiconductor device according to the fifth embodiment.

FIGS. 24 and 25 are cross-sectional views illustrating the overall configuration of main units in a method of manufacturing the semiconductor device according to a fifth embodiment.

In this embodiment, a gate protection structure will be described when a gate electrode 14 is present on the bottom of a second through hole 17 of a silicon through structure 41. In this embodiment, a gate protection dummy (protection film) 12d is formed in the same process as that of the outer circumference insulation film 12 in the region in which the gate electrode 14 is formed. As a process of etching the second through hole 17 is illustrated in FIG. 24, the gate electrode 14 is covered with the gate protection dummy 12d. Therefore, the gate electrode 14 is protected without being etched even in excessive etching by the micro-loading effect. Further, since the outer circumference of the second through hole 17 is protected by the outer circumference insulation film 12, a notch is prevented from being formed.

When the bottom of the through hole is etched after the formation of an inner wall insulation film 18, the gate protection dummy 12d is etched, and then is filled with a barrier metal layer 19 and a copper layer in a subsequent process. As illustrated in FIG. 25, a silicon through structure 41 is formed. Since the configuration of the other units is the same as that of the semiconductor device described above in the first embodiment, the description will not be repeated. The same reference numerals are given to the same units.

In the configuration according to the comparative example illustrated in FIG. 26, there is a high probability that the gate electrode 14 is spattered and flies to its periphery due to the excessive etching. Therefore, it is difficult to form the uniform gate electrode 14 below the silicon through structure 41 as in the TSV. Accordingly, the insulation film 15 on the silicon substrate 10 serving as the semiconductor substrate is directly present immediately below the silicon through structure 41 having the large cross-sectional area. It is also preferable to comprise an element isolation film of an element section. Thereby the outer circumference insulation film is able to be formed in the same process of forming the element isolation film of an element section in this embodiment.

In this embodiment, however, since the gate electrode 14 can be formed immediately below the silicon through structure 41, a layout can be easily designed. Note that, the gate electrode 14 formed below the silicon through structure 41 is generally called a dummy gate. In order to improve pattern accuracy of the gate electrode 14, the pattern is uniformly formed on the wafer.

In the above embodiment, even when at least any one of the first and second through holes is filled with an insulating layer, it becomes possible to suppress the reliability deterioration of the element since the contaminated material, or impurities contained with the insulating layer, is prevented from diffusing due to the notch. The contaminated material is comparably light element such as B (Boron), H (Hydrogen), which can be defused easily, or material which is contained with coating agent in the case of the insulating layer being an coating film, and so on.

The specific examples of the embodiments have hitherto been described. However, the embodiments are not limited to the specific examples. That is, examples modified appropriately from the specific examples in the design by those skilled in the art are also included in the scope of the embodiments as long as the examples have the characteristics of the embodiments. The invention is not limited to the exemplified constituent elements, their dispositions, materials, conditions, shapes, sizes, and the like in the above-described specific examples, but appropriate modifications thereof can be made.

The constituent elements of the above-described embodiments can be combined, when the combination can be technically realized. The combination thereof is also included in the embodiments, as long as the combination has the characteristics of the embodiments. It should be apparent to those skilled in the art that various modified examples can be made and the modified examples pertain to the scope of the embodiments.

For example, even when some of the constituent elements are deleted from all of the constituent elements described above in the first to fifth embodiments, if the above-described problem can be resolved, and the above-described advantage can be obtained, the configuration in which the constituent elements are deleted can be realized as the invention. Further, the constituent elements described above in the first to fifth embodiments may be appropriately combined.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising a semiconductor substrate having:
    first through hole penetrating from a rear surface side of an element formation surface of a semiconductor substrate to the element formation surface, and
    second through hole penetrating from the rear surface side of the element formation surface of the semiconductor substrate to the element formation surface,
    having a larger opening area than that of the first through hole, and
    having an outer circumference insulation film formed on a side wall of a bottom of the second through hole to surround an outer circumference of the second through hole.

2. The semiconductor device according to claim 1, wherein the first and second through holes respectively include:
    inner wall insulation films that cover inner walls except the bottoms of the first and second through holes;
    barrier metal layers that cover insides of the first and second through holes in which the inner wall insulations are formed; and
    conductive layers that fill the first and second through holes in which the barrier metal layers are formed.

3. The semiconductor device according to claim 2, wherein the conductive layer is formed of copper.

4. The semiconductor device according to claim 2, wherein the conductive layer is formed of at least one of nickel, tungsten, polycrystalline silicon, and aluminum.

5. The semiconductor device according to claim 1, wherein the first through hole is a TSV through hole forming a silicon through electrode (TSV), and
    the second through hole is formed as a through hole having a larger opening diameter than the first through hole and forms a mark structure for alignment.

6. The semiconductor device according to claim 1, wherein the first through hole is a TSV through hole forming a silicon through electrode (TSV), and
    the second through hole is formed as a through hole having a larger opening area than the second through hole and forms a guard ring structure.

7. The semiconductor device according to claim 1, wherein the outer circumference insulation film is an insulation film formed in the same process as that of an element isolation film (STI) of an element section.

8. The semiconductor device according to claim 1, wherein the outer circumference insulation film is formed such that an inner circumference surface of the outer circumference insulation film accords with an outer circumference surface of the second through hole.

9. The semiconductor device according to claim 1, wherein the outer circumference insulation film is formed such that an inner circumference surface of the outer circumference insulation film is located to the outside from an outer circumference surface of the second through hole.

10. The semiconductor device according to claim 1, wherein a dummy gate is formed immediately below the second through hole surrounded by the outer circumference insulation film.

11. The semiconductor device according to claim 10, wherein the element formation surface includes an element isolation film.

12. A method of manufacturing a semiconductor device, comprising:
    forming first and second through holes that penetrate from a rear surface of an element formation surface of a semiconductor substrate to the element formation surface and have different opening areas;
    filling the first and second through holes with a conductive layer; and
    forming an outer circumference insulation film on a side wall of a bottom of the second through hole to surround an outer circumference of a region in which the second through hole having the larger opening area than the first through hole is formed, before forming the first and second through holes.

13. The method of manufacturing the semiconductor device according to claim 12,
    wherein the semiconductor substrate is a silicon substrate, and
    the forming the first and second through holes comprises:
    forming the first and second through holes by an RIE process from a rear surface side of the silicon substrate.

14. The method of manufacturing the semiconductor device according to claim 13, further comprising:
    forming inner wall insulation films that cover inner walls other than the bottoms of the first and second through holes;
    forming barrier metal layers that cover insides of the first and second through holes in which the inner wall insulations are formed; and
    forming conductive layers that fill the first and second through holes in which the barrier metal layers are formed.

15. The method of manufacturing the semiconductor device according to claim 14,
    wherein forming of the outer circumference insulation film is the process in which the outer circumference insulation film is formed in a region in which a mark structure for alignment is formed.

16. The method of manufacturing the semiconductor device according to claim 14,
    wherein forming of the outer circumference insulation film is the process in which the outer circumference insulation film is formed to surround a guard ring formation region.

17. The method of manufacturing the semiconductor device according to claim 14,
    wherein forming the outer circumference insulation film is the process in which the outer circumference insulation film is formed such that an inner circumference surface accords with an outer circumference of the second through hole.

18. The method of manufacturing the semiconductor device according to claim 14,
   wherein forming the outer circumference insulation film is the process in which the outer circumference insulation film is formed such that an inner circumference surface is disposed to the outside from an outer circumference of the second through hole.

19. The method of manufacturing the semiconductor device according to claim 14,
   wherein forming of the outer circumference insulation film includes the process of forming a protection film to cover a dummy gate present immediately below the second through hole surrounded by the outer circumference insulation film.

20. The method of manufacturing the semiconductor device according to claim 12,
   wherein forming of the outer circumference insulation film is the same process as a process of forming an element isolation film (STI) on the element formation surface.

* * * * *